(12) United States Patent
Obata et al.

(10) Patent No.: US 12,027,647 B2
(45) Date of Patent: Jul. 2, 2024

(54) SEMICONDUCTOR LIGHT-EMITTING ELEMENT

(71) Applicant: STANLEY ELECTRIC CO., LTD., Tokyo (JP)

(72) Inventors: Toshiyuki Obata, Tokyo (JP); Yasuhiro Hashimoto, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 350 days.

(21) Appl. No.: 17/285,848

(22) PCT Filed: Oct. 7, 2019

(86) PCT No.: PCT/JP2019/039454
§ 371 (c)(1),
(2) Date: Apr. 15, 2021

(87) PCT Pub. No.: WO2020/080159
PCT Pub. Date: Apr. 23, 2020

(65) Prior Publication Data
US 2021/0288216 A1 Sep. 16, 2021

(30) Foreign Application Priority Data
Oct. 17, 2018 (JP) .................................. 2018-195599

(51) Int. Cl.
*H01L 33/32* (2010.01)
*H01L 33/06* (2010.01)

(52) U.S. Cl.
CPC ............ *H01L 33/325* (2013.01); *H01L 33/06* (2013.01)

(58) Field of Classification Search
CPC .............................. H01L 33/325; H01L 33/06
See application file for complete search history.

(56) References Cited

U.S. PATENT DOCUMENTS

| 11,107,952 B2 | 8/2021 | Watanabe |
| 2014/0008608 A1 | 1/2014 | Kim et al. |

(Continued)

FOREIGN PATENT DOCUMENTS

| EP | 2709170 A2 | 3/2014 |
| JP | 2004266287 A | 9/2004 |

(Continued)

OTHER PUBLICATIONS

Extended European Search Report (EESR) dated Jun. 20, 2022, issued in counterpart European Application No. 19874318.9.

(Continued)

*Primary Examiner* — Mark W Tornow
(74) *Attorney, Agent, or Firm* — Holtz, Holtz & Volek PC

(57) ABSTRACT

A semiconductor light-emitting element according to the present invention includes an n-type semiconductor layer, an active layer, a p-type semiconductor layer, and a p-electrode. The n-type semiconductor layer has a composition of AlGaN or AlInGaN. The active layer is formed on the n-type semiconductor layer. The active layer contains an AlGaN semiconductor or an AlInGaN semiconductor. The p-type semiconductor layer is formed on the active layer. The p-type semiconductor layer has a composition of AlN, AlGaN, or AlInGaN. The p-electrode is formed on the p-type semiconductor layer. The p-type semiconductor layer includes a contact layer formed on the p-electrode. The contact layer includes an AlGaN layer or an AlInGaN layer in which a band gap decreases toward an interface with the p-electrode. The contact layer includes a tunneling contact layer in contact with the p-electrode. The tunneling contact layer is connected to the p-electrode by a tunnel junction.

10 Claims, 6 Drawing Sheets

(56) References Cited

U.S. PATENT DOCUMENTS

| | | | |
|---|---|---|---|
| 2016/0247970 A1* | 8/2016 | Zhang | H01L 33/06 |
| 2018/0069150 A1 | 3/2018 | Oh et al. | |
| 2018/0323338 A1* | 11/2018 | Grundmann | H01L 33/32 |
| 2018/0331255 A1* | 11/2018 | Grundmann | H01L 33/0025 |

FOREIGN PATENT DOCUMENTS

| | | |
|---|---|---|
| JP | 2005033197 A | 2/2005 |
| JP | 2014086533 A | 5/2014 |
| JP | 2016164966 A | 9/2016 |
| WO | 2014065259 A1 | 5/2014 |
| WO | 2015182207 A1 | 12/2015 |
| WO | 2018181044 A1 | 10/2018 |

OTHER PUBLICATIONS

Zhang, et al., "Reflective Metal/Semiconductor Tunnel Junctions for Hole Injection in AlGaN UV LEDs", Applied Physics Letters, American Institute of Physics, vol. 111, No. 5, published Aug. 2, 2017.

Japanese Office Action (and a English language translation thereof) dated Jul. 19, 2022, issued in counterpart Japanese Application No. 2018-195599.

Jo et al., "Enhanced light extraction in 260 nm light-emitting diode with a highly transparent p-AlGaN layer," *Applied Physics Express* 9, 012102 (2016), a Non-Patent Literature document discussed on p. 1 of the present specification.

International Search Report (ISR) (and English translation thereof) dated Dec. 17, 2019 issued in International Application No. PCT/JP2019/039454.

Written Opinion dated Dec. 17, 2019 issued in International Application No. PCT/JP2019/039454.

JP 2005-033197, JP 2016-164966 (and its patent family member WO 2015/182207), JP 2014-086533 (and its patent family member WO 2014/065259), and JP 2004-266287.

Japanese Office Action (and an English language translation thereof) dated Jan. 10, 2023, issued in counterpart Japanese Application No. 2018-195599.

Jo et al, "Enhanced light extraction in 260 nm light-emitting diode with a highly transparent p-AlGaN layer," Applied Physics Express 9, 012102 (2016), published online Dec. 4, 2015.

Chinese Office Action (and an English language translation thereof) dated Nov. 4, 2023, issued in counterpart Chinese Application No. 201980068568.8.

Chinese Office Action (and an English language translation thereof) dated Apr. 27, 2024, issued in counterpart Chinese Application No. 201980068568.8.

\* cited by examiner

SEMICONDUCTOR LIGHT-EMITTING ELEMENT

TECHNICAL FIELD

The present invention relates to a semiconductor light-emitting element, especially, a semiconductor light-emitting element that emits a light in an ultraviolet region.

BACKGROUND ART

Recently, as a new light source having a sterilization action to air and water, a semiconductor light-emitting element having an emission wavelength band in an ultraviolet region (for example, peak wavelength is 200 nm to 365 nm), especially, in a deep ultraviolet region (for example, peak wavelength is 200 to 300 nm) has been attracting attention. For example, Non-Patent Document 1 discloses a light-emitting element that includes a p-type contact layer having an AlGaN composition and has an emission wavelength in a deep ultraviolet region.

Non-patent Document 1: Applied Physics Express 9, 012102 (2016)

DISCLOSURE OF THE INVENTION

Problems to be Solved by the Invention

The semiconductor light-emitting element having the emission wavelength in the ultraviolet region has a problem in high output power. Especially, for an ultraviolet light-emitting element formed of a nitride semiconductor, it is one of the problems that a light emitted from an active layer is not easily extracted outside, that is, a low light extraction efficiency.

The present invention has been made in consideration of the above-described points and an object of which is to provide a semiconductor light-emitting element having a high output power in an ultraviolet region.

Solution to the Problem

A semiconductor light-emitting element according to the present invention includes an n-type semiconductor layer, an active layer, a p-type semiconductor layer, and a p-electrode. The n-type semiconductor layer has a composition of AlGaN or AlInGaN. The active layer is formed on the n-type semiconductor layer. The active layer contains an AlGaN semiconductor or an AlInGaN semiconductor. The p-type semiconductor layer is formed on the active layer. The p-type semiconductor layer has a composition of AlN, AlGaN, or AlInGaN. The p-electrode is formed on the p-type semiconductor layer. The p-type semiconductor layer includes a contact layer formed on the p-electrode. The contact layer includes an AlGaN layer or an AlInGaN layer in which a band gap decreases toward an interface with the p-electrode. The contact layer includes a tunneling contact layer in contact with the p-electrode. The tunneling contact layer is connected to the p-electrode by a tunnel junction.

DESCRIPTION OF PREFERRED EMBODIMENTS

The following describes embodiments of the present invention in detail.

Embodiment 1

Figure 1:
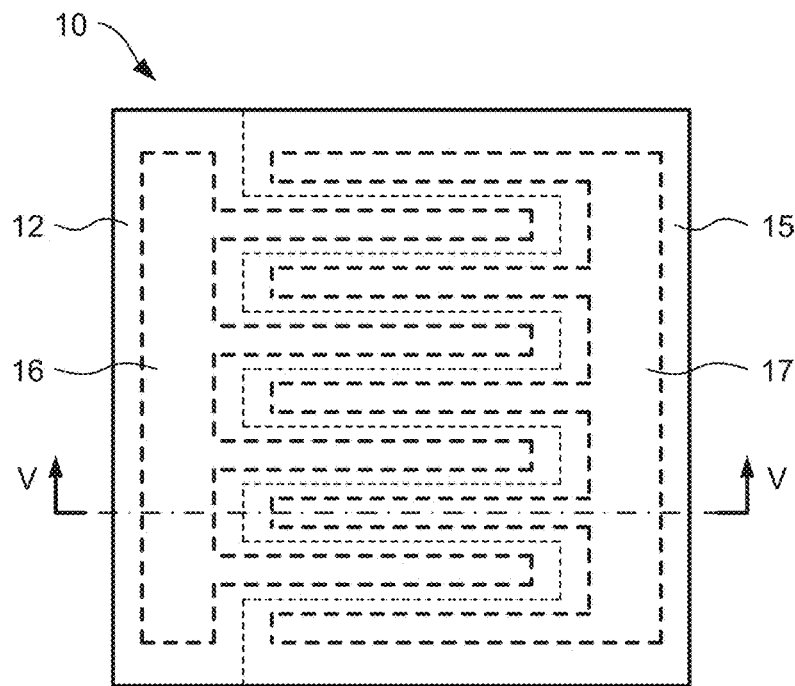
FIG. 1 is a top view of a semiconductor light-emitting element according to Embodiment 1.
Figure 2:
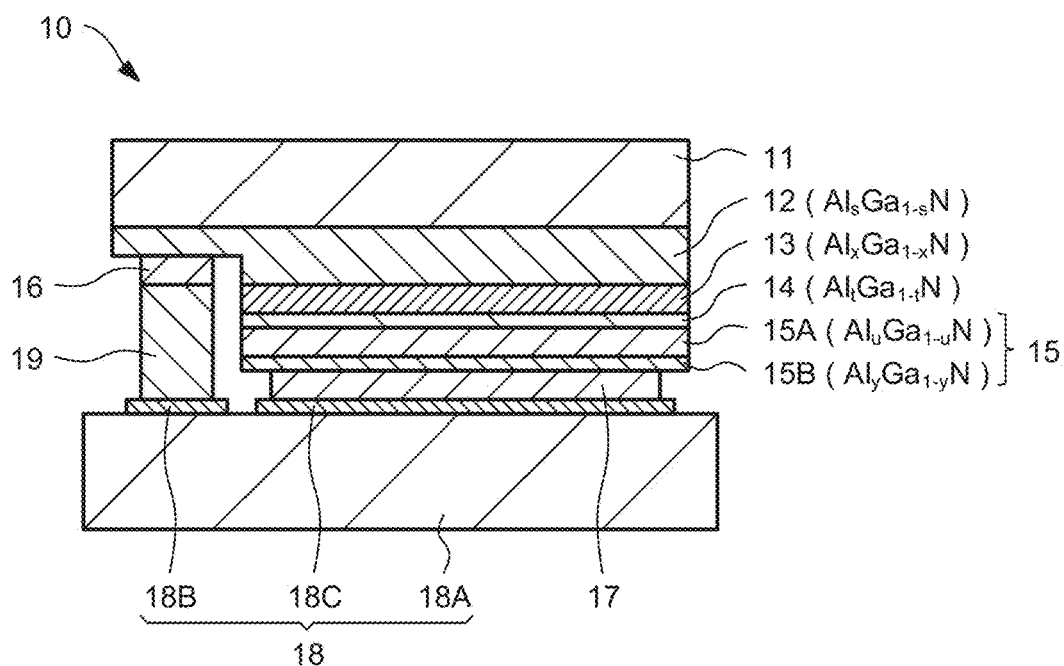
FIG. 2 is a cross-sectional view of the semiconductor light-emitting element according to Embodiment 1.
Figure 3:
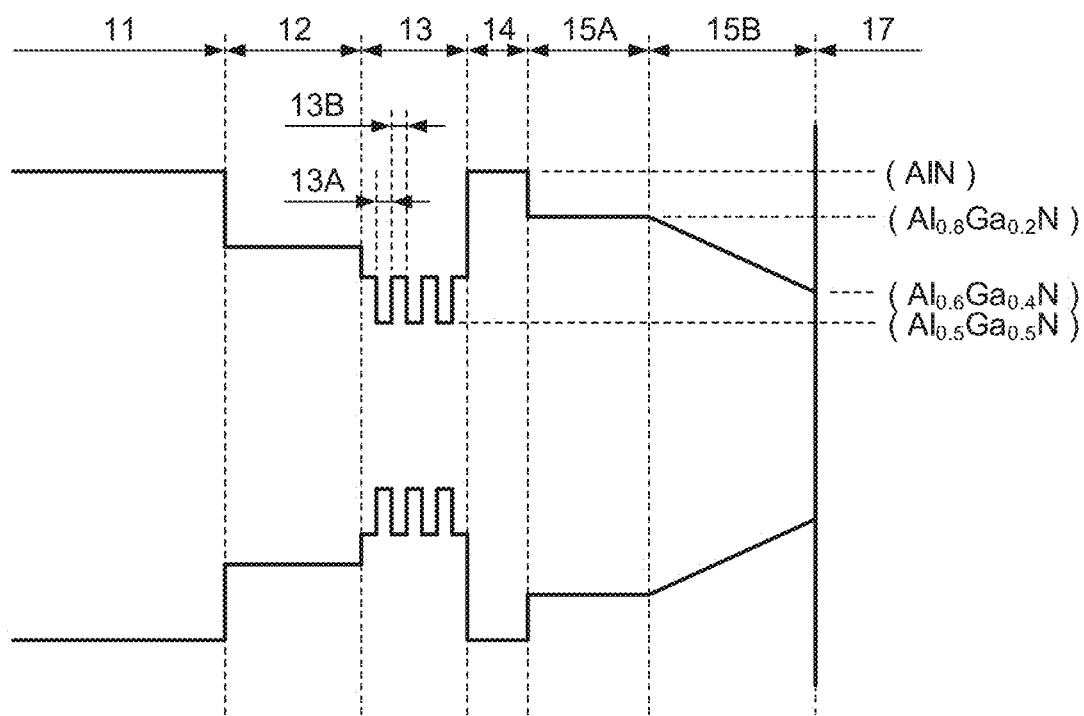
FIG. 3 is a band diagram of the semiconductor light-emitting element according to Embodiment 1.

FIG. 1 is a top view of a semiconductor light-emitting element (hereinafter simply referred to as a light-emitting element) 10 according to Embodiment 1. FIG. 2 is a cross-sectional view of the light-emitting element 10, and is a cross-sectional view taken along the line V-V in FIG. 1. FIG. 3 is a band diagram of the light-emitting element 10. A configuration of the light-emitting element 10 will be described with reference to FIG. 1 to FIG. 3.

First, a structure of the light-emitting element 10 will be described. In this embodiment, the light-emitting element 10 includes a nitride semiconductor having an emission wavelength band in an ultraviolet region (for example, in a range of 200 to 365 nm).

The light-emitting element 10 includes an n-type semiconductor layer 12, an active layer 13, an electron-blocking layer 14, and a p-type semiconductor layer 15, which are formed on a growth substrate 11. The n-type semiconductor layer 12 to the p-type semiconductor layer 15 function as a light-emitting structure layer in the light-emitting element 10. The light-emitting element 10 includes an n-electrode 16 and a p-electrode 17 connected to the n-type semiconductor layer 12 and the p-type semiconductor layer 15, respectively.

First, in this embodiment, the growth substrate 11 is formed of an AlN substrate, a GaN substrate, a sapphire substrate, a SiC substrate, a Si substrate, or the like. In this embodiment, the growth substrate 11 is a single crystal AlN substrate. That is, the n-type semiconductor layer 12 to the p-type semiconductor layer 15 are each a semiconductor layer epitaxially grown on the single crystal AlN substrate as the growth substrate 11.

Note that, considering the growth of n-type semiconductor layer 12 to the p-type semiconductor layer 15 with a high crystal quality, the growth substrate 11 is preferably has a relatively low dislocation density. For example, the dislocation density of the growth substrate 11 is preferably $10^8$ cm$^{-2}$ or less, and further preferably $10^7$ cm$^{-2}$ or less. Note that, the dislocation density can be measured using a known method, for example, measuring the number of dislocations in a transmission electron microscope image, and measuring the number of etch pits measured after immersing it in a heated acid mixture solution.

In this embodiment, the growth substrate 11 has a +C plane as a crystal growth surface. Therefore, in this embodiment, the n-type semiconductor layer 12 to the p-type semiconductor layer 15 are semiconductor layers grown on the C plane of the AlN substrate. However, the crystal growth surface of the growth substrate 11 is not limited to the case of the +C plane, and for example, a plane inclined (off) from the C plane may be used as a crystal growth surface. When the plane inclined from the +C plane is used as the crystal growth surface, the inclined angle (off angle) is preferably in a range of 0.1 to 0.5°, and further preferably in a range of 0.3 to 0.4°. The crystal growth surface of the growth substrate 11 may be an M plane or an A plane.

The thickness of the growth substrate 11 can be determined by considering decrease of an absorption coefficient of the light, ease in handling (yield), and the like. The thickness of the growth substrate 11 is preferably, for example, in a range of 50 to 1000 μm.

A buffer layer (not illustrated) may be disposed between the growth substrate 11 and the n-type semiconductor layer 12. When the buyer layer is disposed, for example, the buffer layer preferably includes a single AlN layer, has a superlattice structure including an AlN layer and an AlGaN layer, has a superlattice structure including AlGaN layers having mutually different compositions, has a structure in which a gradient is provided to the composition such that the Al composition decreases toward the n-type semiconductor layer 12, or has a structure in which these structures are combined. The buffer layer preferably includes, for example, the AlGaN layer having the high Al composition compared with the n-type semiconductor layer 12. However, the buffer layer only needs to have a composition contributing to improving the yield in the crystal growth process of the n-type semiconductor layer 12 to the p-type semiconductor layer 15.

When the buffer layer is disposed, for example, in considering the productivity, the buffer layer preferably has a layer thickness in a range of 1 to 10000 nm, and further preferably has the layer thickness in a range of 10 to 5000 nm.

With reference to FIG. 2 and FIG. 3, the n-type semiconductor layer 12 is formed on the growth substrate 11. The n-type semiconductor layer 12 has a function of injecting electrons to the active layer 13.

The n-type semiconductor layer 12 has a composition of $Al_sGa_{1-s}N$ (0<s<1, preferably x2≤s≤0.9, x2 is an Al composition of a barrier layer 13B of the active layer 13 described later). In this embodiment, the n-type semiconductor layer 12 has the composition of $Al_{0.7}Ga_{0.3}N$. The n-type semiconductor layer 12 preferably has the layer thickness of, for example, 100 nm or more. The n-type semiconductor layer 12 preferably has a low dislocation density.

The n-type semiconductor layer 12 may contain In. For example, the n-type semiconductor layer 12 may have the composition of AlInGaN. In this case as well, the n-type semiconductor layer 12 preferably has a band gap, for example, equal to that of the barrier layer 13B of the active layer 13 or more and $Al_{0.9}Ga_{0.1}N$ or less. That is, the n-type semiconductor layer 12 only needs to have the composition of AlGaN or AlInGaN.

The n-type semiconductor layer 12 contains Si or the like as an n-type dopant, and has a conductivity type of n-type. A dopant concentration of the n-type semiconductor layer 12 is not specifically limited and may be appropriately determined depending on the purpose. For example, in considering providing a high conductive property, the dopant concentration of the n-type semiconductor layer 12 is preferably in a range of $1 \times 10^{15}$ to $5 \times 10^{19}$ cm$^{-3}$.

The n-type semiconductor layer 12 may include a plurality of semiconductor layers exhibiting the conductivity type of n-type. In this case, the semiconductor layers each preferably have the dopant concentration in a range of $1 \times 10^{15}$ to $5 \times 10^{19}$ cm$^{-3}$.

The active layer 13 is formed on the n-type semiconductor layer 12 and has a band gap equal to or less than that of the n-type semiconductor layer 12. The active layer 13 functions as a light-emitting layer. In this embodiment, the active layer 13 has a crystal composition containing an AlGaN semiconductor. Specifically, the active layer 13 has a composition of $Al_xGa_{1-x}N$ (0<x<1). The active layer 13 emits a light in the ultraviolet region. It is preferred that the active layer 13 is directly formed on the n-type semiconductor layer 12, that is, in contact with the n-type semiconductor layer 12.

The active layer 13 may contain In. For example, the active layer 13 may have the composition of AlInGaN. In this case as well, the active layer 13 only needs to have the band gap, for example, larger than that of GaN and smaller than that of AlN. That is, the active layer 13 only needs to have the crystal composition containing the AlGaN semiconductor or an AlInGaN semiconductor.

In this embodiment, as illustrated in FIG. 3, the active layer 13 has a multiple quantum well (MQW) structure. In this embodiment, the active layer 13 includes a plurality of well layers 13A each having the composition of $Al_{x1}Ga_{1-x1}N$, and a plurality of barrier layers 13B each having the composition of $Al_{x2}Ga_{1-x2}N$ and the large band gap compared with the well layer 13A.

In this embodiment, the well layers 13A each have the composition of $Al_{0.5}Ga_{0.5}N$, and the barrier layers 13B each have the composition of $Al_{0.65}Ga_{0.35}N$. For example, the well layers 13A each have the layer thickness in a range of 3 to 6 nm, and the barrier layers 13B each have the layer thickness in a range of 3 to 10 nm.

In this embodiment, the Al composition x2 of the barrier layer 13B is smaller than the Al composition s of the n-type semiconductor layer 12. Therefore, the barrier layer 13B has the small band gap compared with the n-type semiconductor layer 12. Accordingly, in this embodiment, a level difference of the band gap is provided between the n-type semiconductor layer 12 and the barrier layer 13B.

The configuration of the active layer 13 is not limited to this. For example, the active layer 13 is not limited to the case of having the multiple quantum well structure. For example, the active layer 13 may have a single quantum well structure or may be formed of a singe layer.

The electron-blocking layer 14 is formed on the active layer 13 and has a large band gap compared with the active layer 13. The electron-blocking layer 14 has a composition of $Al_tGa_{1-t}N$ (s<t≤1). The electron-blocking layer 14 functions as a layer that suppresses an overflow of the electrons injected into the active layer 13 to the p-type semiconductor layer 15.

In this embodiment, the electron-blocking layer 14 has the large band gap compared with the n-type semiconductor layer 12. In this embodiment, the electron-blocking layer 14 has the composition the same as that of the growth substrate 11, that is, the composition of AlN (corresponding to the case of t=1). For example, the electron-blocking layer 14 has a layer thickness in a range of 1 to 50 nm.

In this embodiment, the electron-blocking layer 14 contains Mg or the like as a p-type dopant and has a conductivity type of p-type. However, the electron-blocking layer 14 does not need to contain the p-type dopant or may partially contain the p-type dopant. The electron-blocking layer 14 does not need to be disposed. That is, the p-type semiconductor layer 15 may be disposed on the active layer 13.

The p-type semiconductor layer 15 has a band gap equal to or less than that of the electron-blocking layer 14. The p-type semiconductor layer 15 contains Mg or the like as a p-type dopant and has a conductivity type of p-type. The p-type semiconductor layer 15 functions as a cladding layer together with the n-type semiconductor layer 12. In this embodiment, the p-type semiconductor layer 15 includes a p-type cladding layer 15A and a contact layer 15B. The p-type cladding layer 15A functions as a cladding layer. The contact layer 15B is disposed on an interface with the p-electrode 17 to be in contact with the p-electrode 17 and forms an electrical connection with the p-electrode 17.

The p-type cladding layer 15A has a composition of $Al_uGa_{1-u}N$ (x2<u<1, u≤t). That is, the p-type cladding layer 15A has a band gap equal to or less than that of the electron-blocking layer 14. For example, the p-type cladding layer 15A has a composition of $Al_{0.8}Ga_{0.2}N$. For example, the p-type cladding layer 15A has a layer thickness in a range of 1 to 100 nm.

The contact layer 15B has a composition in which the band gap monotonically decreases from an interface with the p-type cladding layer 15A toward the interface with the p-electrode 17 along a direction (layer thickness direction of each layer) perpendicular to the p-type semiconductor layer 15. In this embodiment, the contact layer 15B has the composition in a range of $Al_yGa_{1-y}N$ (0≤y≤1), and is configured to have the Al composition y continuously decreasing toward the p-electrode 17.

The Al composition y of the contact layer 15B is preferably configured to gradually decrease toward the p-electrode 17 within a range larger than the Al composition x1 of the well layer 13A of the active layer 13. That is, the Al composition y of the contact layer 15B preferably changes in a range of x1≤y≤1.

Accordingly, the contact layer 15B has the large band gap compared with the well layer 13A as a whole. With the Al composition y of the contact layer 15B changing in the range of x1≤y≤1, the wavelength of the light emitted from the active layer 13 can be provided with translucency. Accordingly, the light extraction efficiency of the light-emitting element 10 is improved.

In this embodiment, the contact layer 15B has the composition of $Al_{0.8}Ga_{0.2}N$ (composition the same as that of the p-type cladding layer 15A) on the interface with the p-type cladding layer 15A. The contact layer 15B has the composition of $Al_{0.6}Ga_{0.4}N$ on the interface with the p-electrode 17. That is, in the contact layer 15B, the Al composition y decreases from 0.8 to 0.6 toward the p-electrode 17. For example, the contact layer 15B has the layer thickness of 20 to 60 nm.

For example, a change rate (decrease rate) of the Al composition y in the contact layer 15B is in a range of 0.0008 $nm^{-1}$ to 0.05 $nm^{-1}$. The range of the change rate of the Al composition y in the contact layer 15B is preferably a range of 0.0008 $nm^{-1}$ to 0.035 $nm^{-1}$, and more preferably a range of 0.003 $nm^{-1}$ to 0.03 $nm^{-1}$.

The Al composition y of the contact layer 15B only needs to monotonically decrease toward the p-electrode 17. For example, the Al composition y of the contact layer 15B is not limited to the case of continuously (linearly) decreasing as illustrated in FIG. 3, but may decrease, for example, in phase (in a staircase pattern). That is, for example, the contact layer 15B is an AlGaN layer having the composition in which the Al composition y decreases continuously or in phase from the interface with the p-type cladding layer 15A toward the interface with the p-electrode 17.

In this embodiment, the respective band gaps of the n-type semiconductor layer 12, the active layer 13, the electron-blocking layer 14, and the p-type semiconductor layer 15 (p-type cladding layer 15A and contact layer 15B) have a relationship as illustrated in FIG. 3.

With reference to FIG. 1. and FIG. 2, the n-electrode 16 is formed on the n-type semiconductor layer 12, and the p-electrode 17 is formed on the p-type semiconductor layer 15 (contact layer 15B). For example, the n-electrode 16 includes a laminated body of a Ti layer, an Al layer, and an Au layer.

An exemplary configuration of the p-electrode 17 includes: a laminated body of a Ni layer and an Au layer, and a laminated body of a Pt layer or a Pd layer and an Au layer, or the like. Another exemplary configuration of the p-electrode 17 includes one in which a metal oxide, such as ITO, is extremely thinned and subsequently a material, such as Al, having a reflectivity to an ultraviolet light is laminated. Note that, the p-electrode 17 is preferably formed of a material, such as a Rh layer or a Ru layer, that can form a satisfactory ohmic contact with a p-type nitride semiconductor and has a high reflectance to an ultraviolet light.

In this embodiment, a depressed portion (mesa structure portion) having a comb shape in top view is formed on the surface of the p-type semiconductor layer 15. The depressed portion penetrates the p-type semiconductor layer 15, the electron-blocking layer 14, and the active layer 13 to reach the n-type semiconductor layer 12. The n-electrode 16 is formed in the comb shape on the surface of the n-type semiconductor layer 12 exposed on the bottom portion of the depressed portion.

The p-electrode 17 is formed in a laminated manner and in a comb shape on the surface of the p-type semiconductor layer 15 on which the depressed portion is not disposed, and disposed such that its comb teeth mesh with the comb teeth of the n-electrode 16 in top view.

In this embodiment, the light-emitting element 10 includes a supporting substrate (mounting substrate) 18 that supports the light-emitting structure layer from the p-type semiconductor layer 15 side. The supporting substrate 18 includes a substrate body 18A, and an n-side pad electrode 18B and a p-side pad electrode 18C formed on the substrate body 18A. The n-side pad electrode 18B and the p-side pad electrode 18C are connected to the n-electrode 16 and the p-electrode 17, respectively. In this embodiment, the light-emitting element 10 includes a connecting electrode 19 that connects the n-side pad electrode 18B and the n-electrode 16. In other words, the light-emitting element 10 is mounted by a flip chip mounting.

The above-described configurations of the n-type semiconductor layer 12 to the p-type semiconductor layer 15 and configurations of the n-electrode 16 and the p-electrode 17 are merely examples. For example, the n-electrode 16 only needs to be in contact with the n-type semiconductor layer 12, and the p-electrode 17 only needs to be in contact with the p-type semiconductor layer 15. That is, the configuration (electrode shape and the like) of the light-emitting element 10, for example, illustrated in FIG. 1 and FIG. 2 is merely an example. Supporting means or mounting means of the light-emitting element 10 is not limited to this.

Figure 4:
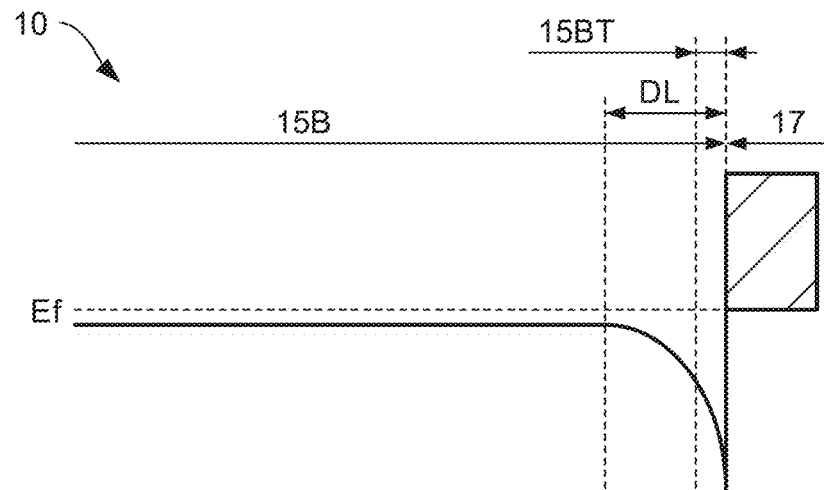
FIG. 4 is a drawing illustrating a band structure of the semiconductor light-emitting element according to Embodiment 1.

FIG. 4 is a drawing schematically illustrating a band structure of a valence band, at the proximity of the contact layer 15B and the p-electrode 17 of the light-emitting element 10. The contact layer 15B will be described in detail with reference to FIG. 4. Dashed lines in FIG. 4 indicate the Fermi level.

In this embodiment, the contact layer 15B includes an AlGaN layer in which the Al composition y gradually decreases toward the interface with the p-electrode 17. The inventor of this application has found that the contact layer 15B formed as such a composition gradient layer improves the electrode property. This is considered because a depletion layer DL formed in the contact layer 15B is significantly thinned, thus easily generating a tunneling effect in the interface with the p-electrode 17.

More specifically, AlGaN is a semiconductor material that has the larger band gap as the Al composition increases and generally has a poor activation rate of electron holes. Therefore, when AlGaN is formed as the contact layer 15B, a high energy barrier (Schottky barrier) is formed on the interface with the p-electrode 17, and a thick depletion layer is easily formed. Accordingly, it is difficult to form the ohmic contact with the p-electrode 17.

In contrast, the contact layer 15B has the composition in which the Al composition y decreases toward the p-electrode 17. Therefore, the band gap of the contact layer 15B gradually decreases toward the p-electrode 17. Accordingly, the activation rate of the electron holes inside the contact layer 15B is significantly increased by the effect of an internal electric field, thus causing the valence band and the Fermi level mutually to come close. Accordingly, as illustrated in FIG. 4, it is considered that the energy band of the contact layer 15B is significantly bent at the proximity of the interface with the p-electrode 17.

Accordingly, it is considered that the depletion layer DL formed in the contact layer 15B is significantly thinned, and the electron holes easily exceed the Schottky barrier because of the tunneling effect. Accordingly, the ohmic contact is formed between the contact layer 15B and the p-electrode 17. That is, the contact layer 15B includes a tunneling contact layer 15BT connected to the p-electrode 17 by a tunnel junction at the proximity of the interface with the p-electrode 17.

The tunneling contact layer 15BT is a region in the contact layer 15B in which the tunneling effect occurs with high probability, and its layer thickness changes depending on the material of the p-electrode 17, the composition of the contact layer 15B, the value of a current to be applied, and the like. However, providing the gradient to the composition of the contact layer 15B as described above can form the tunneling contact layer 15BT appropriate for stably forming the ohmic contact.

Figure 5:
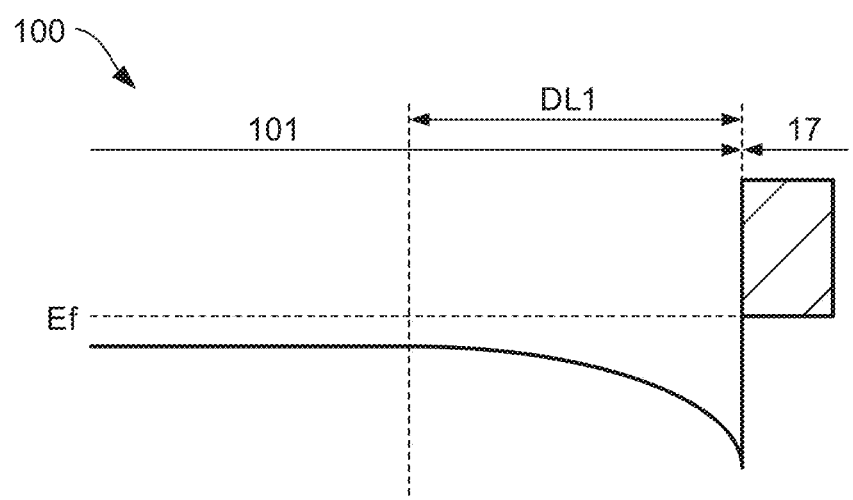
FIG. 5 is a drawing illustrating a band structure of the semiconductor light-emitting element according to a comparative example.

FIG. 5 is a drawing illustrating a band structure of a light-emitting element 100 according to a comparative example. The light-emitting element 100 according to the comparative example includes a contact layer 101 formed of an AlGaN layer having a constant Al composition y (for example, y=0.6) instead of the contact layer 15B.

The energy barrier between the contact layer 101 and the p-electrode 17 formed thereon has a height approximately the same as that formed on the contact layer 15B in this embodiment. Meanwhile, a depletion layer DL1 formed in the contact layer 101 is significantly thick compared with the depletion layer DL formed in the contact layer 15B. This is caused by the significantly low activation rate of the electron holes in the contact layer 101. Therefore, it can be expected that it is difficult to form the satisfactory ohmic contact between the contact layer 101 and the p-electrode 17.

Figure 6A:
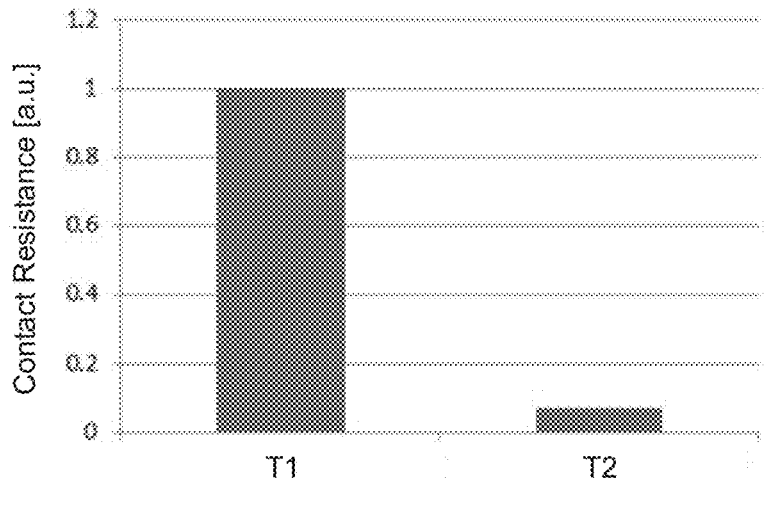
FIG. 6A is a drawing illustrating measurement results of a contact resistance between a p-AlGaN layer having a composition constant in the layer and a p-electrode and a contact resistance between a p-AlGaN layer having a composition different in the layer and the p-electrode.

FIG. 6A is a drawing illustrating measurement results of a contact resistance between a p-AlGaN layer having a composition different in the layer similarly to the contact layer 15B in this embodiment and a metal layer formed of a material similar to that of the p-electrode 17, and a contact resistance between a p-AlGaN layer having a composition constant in the layer similarly to the contact layer 101 in the comparative example and the metal layer. FIG. 6A is a drawing illustrating the contact resistance value between the p-AlGaN layer having the composition different in the layer and the metal layer when the contact resistance value between the p-AlGaN layer having the composition constant in the layer and the metal layer is assumed to be 1.

Figure 6B:
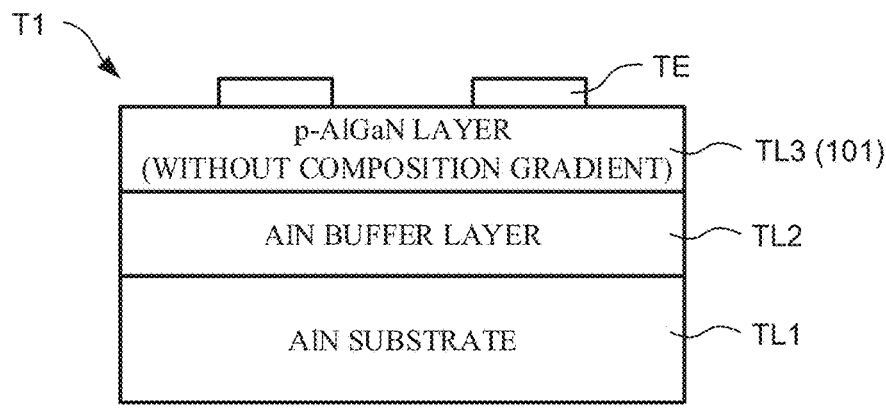
FIG. 6B is a drawing illustrating a configuration of a test structure that includes a p-AlGaN layer having a composition constant in the layer.
Figure 6C:
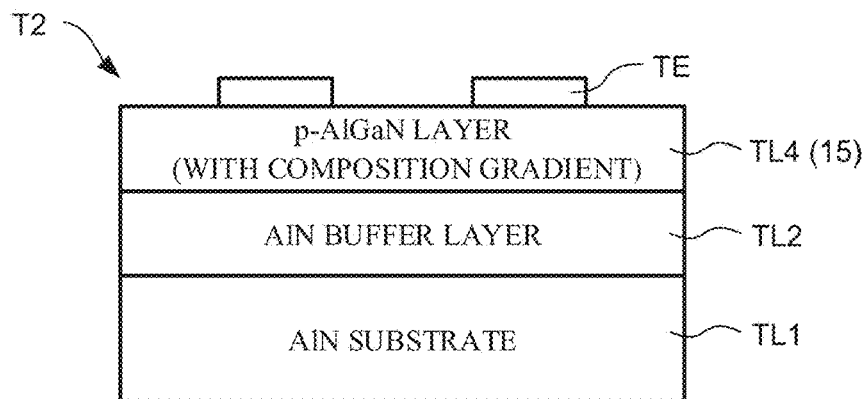
FIG. 6C is a drawing illustrating a configuration of a test structure that includes a p-AlGaN layer having a composition different in the layer.

To obtain the result of FIG. 6A, test structures T1 and T2 as illustrated in FIG. 6B and FIG. 6C were prepared. FIG. 6B is a drawing illustrating a configuration of the test structure T1 that includes a p-AlGaN layer TL3 having a composition similar to that of the contact layer 101 in the comparative example. FIG. 6C is a drawing illustrating a configuration of the test structure T2 that includes a p-AlGaN layer TL4 having a composition similar to that of the contact layer 15B in the embodiment.

First, as illustrated in FIG. 6B, the test structure T1 has a structure in which an AlN buffer layer TL2 and the p-AlGaN layer TL3 are grown on an AlN substrate TL1, and a Ni layer and an Au layer as metal layers TE are formed on the p-AlGaN layer TL3. As illustrated in FIG. 6C, the test structure T2 has a structure in which the AlN buffer layer TL2 and the p-AlGaN layer TL4 are grown on the AlN substrate TL1, and metal layers TE are formed on the p-AlGaN layer TL4.

FIG. 6A is a drawing illustrating measurement results of the contact resistance between the p-AlGaN layer TL3 and the metal layer TE in the test structure T1, and the contact resistance between the p-AlGaN layer TL4 and the metal layer TE in the test structure T2.

As illustrated in FIG. 6A, it is seen that the contact resistance with the metal layer TE is significantly decreased in the p-AlGaN layer TL4 having the different compositions in the layer compared with the p-AlGaN layer TL3 having the constant composition.

Therefore, it is seen that the satisfactory ohmic contact can be formed between the p-AlGaN layer TL4 having the composition different in the layer and the metal layer TE. That is, it is seen that the contact layer 15B and the p-electrode 17 can form the satisfactory ohmic contact. Accordingly, forming the contact layer 15B allows providing the light-emitting element 10 that includes, for example, the contact layer 15B having the low driving voltage and the high translucency.

In considering increasing the activation rate of the electron holes, the contact layer 15B is preferably formed in a state of being distorted. That is, the n-type semiconductor layer 12 to the p-type semiconductor layer 15 as the light-emitting structure layer are preferably epitaxially grown in a pseudomorphic state. Accordingly, like this embodiment, the n-type semiconductor layer 12, the active layer 13, the electron-blocking layer 14, and the p-type semiconductor layer 15 are preferably the semiconductor layers epitaxially grown on the single crystal AlN substrate as the growth substrate 11. Similarly, the contact layer 15B preferably has the composition of AlInGaN.

In considering forming the more satisfactory ohmic contact, the contact layer 15B (especially, the proximity of the interface in contact with the p-electrode 17) preferably has the relatively high dopant concentration. For example, the contact layer 15B preferably has the dopant concentration equal to or more than that of the p-type cladding layer 15A. The contact layer 15B preferably has the high dopant concentration compared with the p-type cladding layer 15A.

For example, the contact layer 15B preferably has the highest dopant concentration at the proximity of the interface with the p-electrode 17, that is, in the tunneling contact layer 15BT. In this case, the contact layer 15B does not need to entirely have the high dopant concentration compared with the p-type cladding layer 15A.

For example, the contact layer 15B may have the dopant concentration equal to or less than that of the p-type cladding layer 15A, or less than that of the p-type cladding layer 15A in the region excluding the tunneling contact layer 15BT, for example, the region in the p-type cladding layer 15A side with respect to the tunneling contact layer 15BT. That is, for example, the contact layer 15B preferably has the high dopant concentration compared with the p-type cladding layer 15A at the proximity of the interface with the p-electrode 17.

Figure 7:
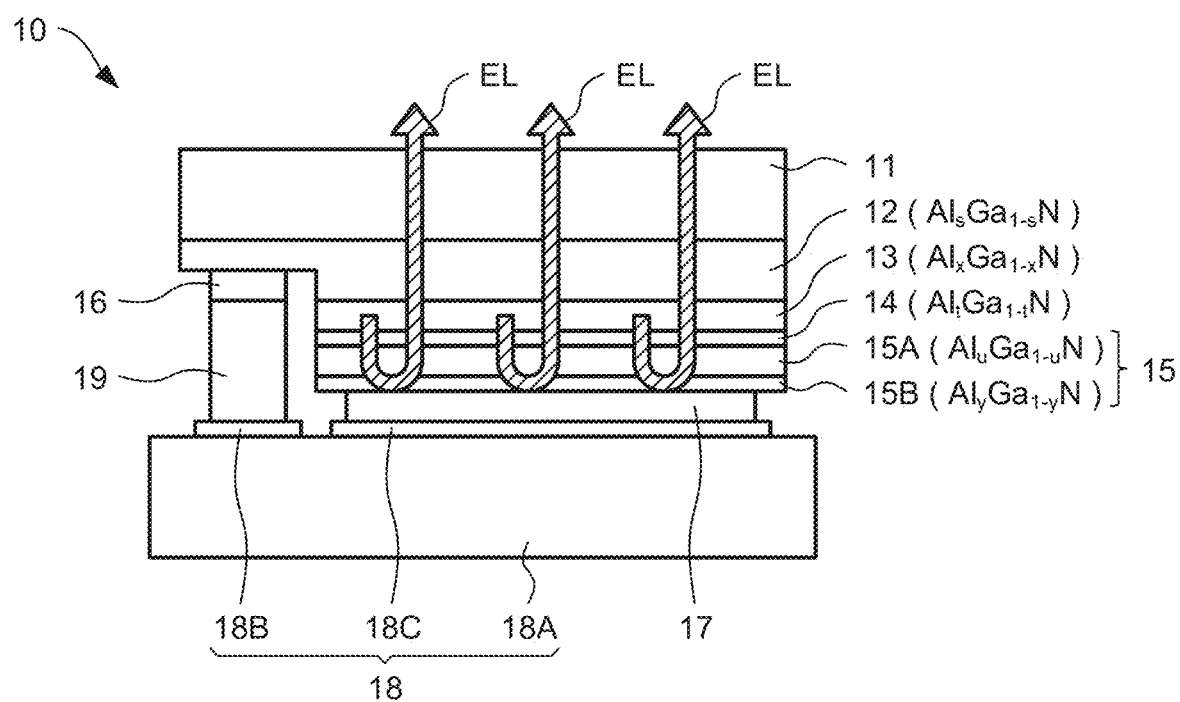
FIG. 7 is a drawing illustrating courses of the lights in the light-emitting element according to Embodiment 1.

FIG. 7 is a drawing schematically illustrating courses of lights in the light-emitting element 10. Note that, for convenience of the explanation, FIG. 7 illustrates only the courses of the lights (reference signs EL) emitted from the active layer 13 toward the p-type semiconductor layer 15 in the light-emitting element 10.

In this embodiment, the contact layer 15B has the AlGaN composition. The contact layer 15B has the Al composition larger than the well layer 13A of the active layer 13. Therefore, the contact layer 15B has the large band gap compared with the well layer 13A.

Accordingly, the contact layer 15B has almost no absorbency to the light (reference sign EL) emitted from the active layer 13, that is, the light having the wavelength corresponding to the band gap of the well layer 13A (in this embodiment, the light in the deep ultraviolet region). Therefore, the most part of the light (reference sign EL) is transmitted through the contact layer 15B. In this embodiment, the n-type semiconductor layer 12, the electron-blocking layer 14, and the entire p-type semiconductor layer 15 have the translucency to the light emitted from the active layer 13.

In this embodiment, the p-electrode 17 has the reflectivity to the light emitted from the active layer 13. Therefore, the light (reference sign EL) transmitted through the p-type semiconductor layer 15 is reflected by the p-electrode 17 toward the n-type semiconductor layer 12 (growth substrate 11). In this embodiment, the growth substrate 11 has the AlN composition. Therefore, the most part of the light emitted from the active layer 13 is extracted outside via the growth substrate 11 without being absorbed in the light-emitting element 10.

That is, in this embodiment, the surface of the growth substrate 11 in the opposite side of the n-type semiconductor layer 12 functions as the light extraction surface of the light-emitting element 10. Then, the light is emitted from the light extraction surface with a high efficiency.

As described above, in this embodiment, the light-emitting element 10 includes the contact layer 15B having the gradually changing composition on the interface with the p-electrode 17. Therefore, the light-emitting structure layer and the electrode can form the satisfactory ohmic contact. Accordingly, the contact layer 15B in which the increase of the driving voltage can be reduced and the light absorption is low can be formed.

Since the p-electrode 17 has the reflectivity, the light emitted from the active layer 13 can be extracted from the light extraction surface with the high efficiency. Accordingly, the light-emitting element 10 having the high luminous efficiency and light extraction efficiency can be provided.

In this embodiment, the p-electrode 17 preferably forms the satisfactory ohmic contact and preferably has the high reflectivity. Therefore, for example, the material of the p-electrode 17 only needs to be selected considering the relationship between the band gap energy corresponding to the emission wavelength of the light-emitting element 10 and the work function, and the reflectivity to the emission wavelength.

For example, as described above, the material of the p-electrode 17 includes Rh or Ru. The material of the p-electrode 17 is not limited to the material having the reflectivity to the emission wavelength and may be an electrode material that is extremely thinned to ensure the translucency. For example, the p-electrode 17 may be a laminated body in which Al or the like having the high reflectance is laminated on a metal oxide, such as ITO, and a metal, such as Ni and Au.

Thus, in this embodiment, the light-emitting element 10 has the emission wavelength band in the ultraviolet region, and the p-type semiconductor layer 15 includes the contact layer 15B having the gradually changing composition on the interface with the p-electrode 17. The p-electrode 17 has the reflectivity to the light in the ultraviolet region. Accordingly, the light-emitting element 10 having the high output power can be provided.

Embodiment 2

Figure 8:
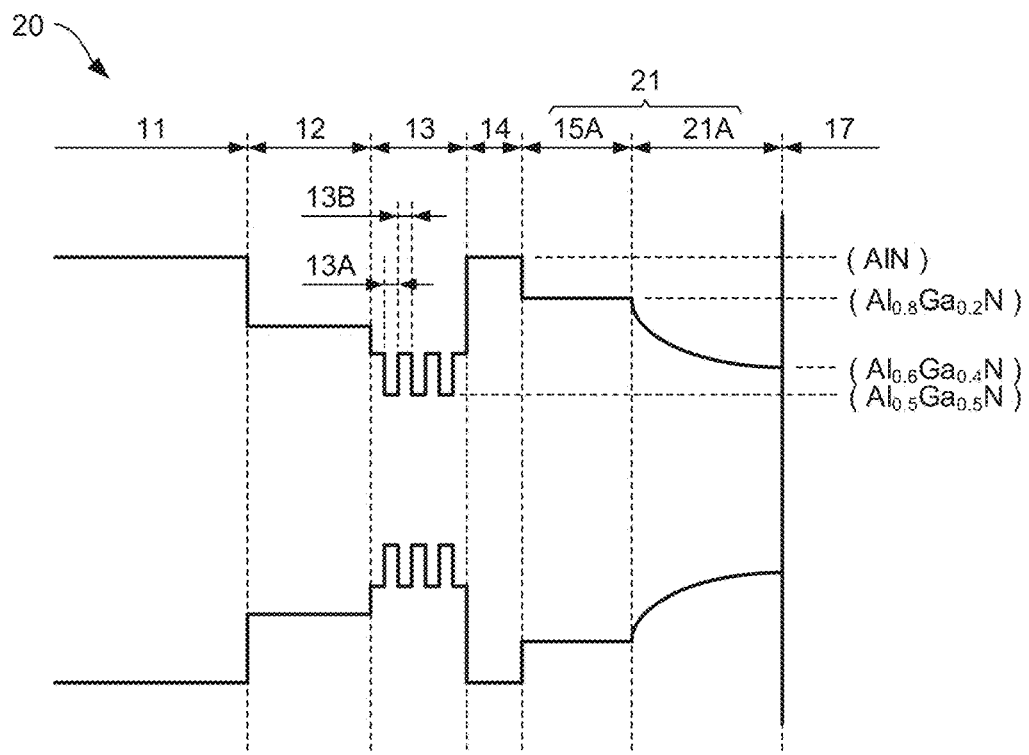
FIG. 8 is a band diagram of a semiconductor light-emitting element according to Embodiment 2.

FIG. 8 is a band diagram of a light-emitting element 20 according to Embodiment 2. The light emitting element 20 has a configuration similar to that of the light-emitting element 10 excluding a configuration of a p-type semiconductor layer 21. The p-type semiconductor layer 21 has a configuration similar to that of the p-type semiconductor layer 15 excluding a configuration of a contact layer 21A.

In this embodiment, a decrease rate of the Al composition y in the contact layer 21A gradually decreases from the interface with the p-type cladding layer 15A. The contact layer 21A has the composition of the p-type cladding layer 15A side and the composition of the p-electrode 17 side similar to those of the contact layer 15B. Therefore, the contact layer 21A exhibits the band gap as illustrated in FIG. 8.

Like this embodiment, the activation rate of the electron holes in the contact layer 21A can be increased also by decreasing the Al composition y while gradually decreasing the decrease rate toward the interface with the p-electrode 17. Therefore, the satisfactory ohmic contact can be formed with the p-electrode 17. Accordingly, the light-emitting element 20 having the high output power can be provided.

Embodiment 3

Figure 9:
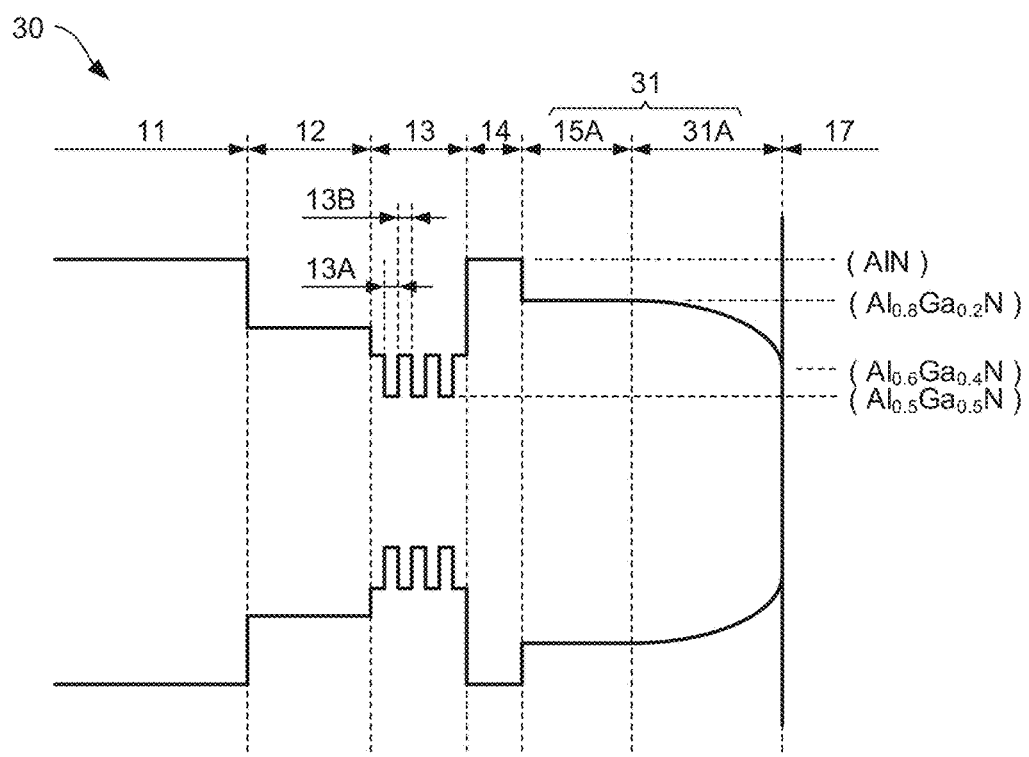
FIG. 9 is a band diagram of a semiconductor light-emitting element according to Embodiment 3.

FIG. 9 is a band diagram of a light-emitting element 30 according to Embodiment 3. The light-emitting element 30 has a configuration similar to that of the light-emitting element 10 excluding a configuration of a p-type semiconductor layer 31. The p-type semiconductor layer 31 has a configuration similar to that of the p-type semiconductor layer 15 excluding a configuration of a contact layer 31A.

In this embodiment, a decrease rate of the Al composition y in the contact layer 31A gradually increases from the interface with the p-type cladding layer 15A. The contact layer 31A has the composition of the p-type cladding layer 15A side and the composition of the p-electrode 17 side similar to those of the contact layer 15B. Therefore, the contact layer 31A exhibits the band gap as illustrated in FIG. 9.

Like this embodiment, the activation rate of the electron holes in the contact layer 31A can be increased also by decreasing the Al composition y while gradually increasing the decrease rate toward the interface with the p-electrode 17. Therefore, the satisfactory ohmic contact can be formed with the p-electrode 17. Accordingly, the light-emitting element 30 having the high output power can be provided.

Similarly to the contact layers 21A and 31A in Embodiments 2 and 3 described above, the contact layer 15B may be configured such that the Al composition y gradually decreases while the change rate changes. In thus configured contact layer 15B as well, a tunneling contact layer similar to the tunneling contact layer 15BT is formed on the interface with the p-electrode 17. Therefore, the satisfactory ohmic contact is formed between the p-type semiconductor layers 15, 21, and 31; and the p-electrode 17. Accordingly, the light-emitting elements 10, 20 and 30 having the high output power can be provided.

The above-described embodiments are merely examples. For example, the contact layers 15B, 21A, and 31A have the large Al composition y (that is, band gap) compared with the well layer 13A of the active layer 13 as a whole. However, the contact layer 15B, 21A or 31A may have the Al composition y partially smaller than that of the well layer 13A. For example, the contact layer 15B may have the small Al composition y compared with the well layer 13A at the proximity of the interface with the p-electrode 17. In this case as well, the most part of the light is transmitted through the contact layer 15B, thus allowing providing the high light extraction efficiency.

In the above description, the case where the p-type semiconductor layers 15, 21, and 31 each include the AlGaN layer having a constant Al composition u as the p-type cladding layer 15A is described, However, the configuration of the p-type semiconductor layers 15, 21, or 31 is not limited to this.

For example, the p-type cladding layer 15A may be a composition gradient layer having the AlGaN composition in which the Al composition u gradually changes. In this case, the whole of the p-type semiconductor layer 15 functions as the cladding layer and the contact layer. That is, the p-type semiconductor layer 15 does not need to include the p-type cladding layer 15A that functions as only the cladding layer.

When the p-type cladding layer 15A is formed, the Al composition y of the contact layer 15B, 21A, or 31A preferably changes with the large change rate compared with the Al composition u of the p-type cladding layer 15A in considering the formation of the ohmic contact.

In other words, the p-type semiconductor layer 15, 21, or 31 only needs to include the contact layer 15B, 21A, or 31A that is formed on the p-electrode 17 and includes the AlGaN layer having the Al composition y gradually decreased toward the interface with the p-electrode 17. Similarly to the contact layer 15B, the contact layers 15B, 21A, and 31A only need to include the tunneling contact layer 15BT that is in contact with the p-electrode 17 and connected to the p-electrode 17 by the tunnel junction.

In considering stably improving the luminous efficiency, it is preferred that the p-type cladding layer 15A is disposed. For example, it is preferred that the p-type semiconductor layer 15, 21, or 31 is formed in the active layer 13 side with respect to the contact layer 15B, 21A, or 31A and includes the p-type cladding layer 15A having the high dopant concentration compared with the contact layer 15B, 21A, or 31A.

However, the contact layer 15B, 21A, or 31A may have the high dopant concentration compared with the p-type cladding layer 15A on the interface with the p-electrode 17. In this case, the dopant concentration of the contact layer 15B, 21A, or 31A may change in the layer of each of them (for example, toward the p-type cladding layer 15A) and become equal to or less than that of the p-type cladding layer 15A, or less than that of the p-type cladding layer 15A in the region excluding the proximity of the interface with the p-electrode 17. Thus, in the case where the dopant concentration is changed in the layer as well, the p-type cladding layer 15A preferably has the high dopant concentration compared with the contact layer 15B, 21A, or 31A.

In the above description, the case where the p-type semiconductor layers 15, 21, and 31 are formed on the electron-blocking layer 14 is described. However, the p-type semiconductor layer 15, 21, or 31 may be formed on the active layer 13 without disposing the electron-blocking layer 14, that is, the semiconductor layer that functions as the electron-blocking layer. In this case, for example, the p-type semiconductor layer 15, 21, or 31 does not need to contain Ga at the proximity of the interface with the active layer 13. That is, the p-type semiconductor layer 15, 21 or 31 may partially have the AlN composition.

In the above description, the case where the contact layer 15B, 21A, and 31A have the AlGaN compositions is described. However, the compositions of the contact layers 15B, 21A, and 31A are not limited to this.

For example, the contact layers 15B, 21A, and 31A only need to have the compositions in which the band gap gradually decreases toward the interface with the p-electrode 17. For example, the contact layer 15B, 21A, or 31A only needs to have the AlInGaN composition. That is, the contact layer 15B, 21A, or 31A may contain In. In this case, it is only necessary that the band gap in the contact layer 15B, 21A, or 31A is adjusted by adjusting the compositions of Al and In.

For example, the contact layer 15B, 21A, or 31A may contain AlInGaN in which the Al composition gradually decreases and the In composition gradually increases toward the interface with the p-electrode 17. For example, the contact layer 15B, 21A, or 31A may contain AlInGaN in which the Al composition gradually decreases toward the interface with the p-electrode 17.

In the case where the contact layers 15B, 21A, and 31A are thus configured as well, it can be expected that the activation rates of the electron holes increase and the depletion layer is thinned. Therefore, the satisfactory ohmic contact allows current injection with a high efficiency, thus allowing providing the light-emitting element 10, 20, or 30 having the high luminous efficiency.

In other words, the p-type semiconductor layer 15, 21, or 31 only needs to have the composition of AlN, AlGaN, or AlInGaN. Then, the contact layer 15B, 21A, or 31A only needs to have the composition of AlGaN or AlInGaN.

In the above description, the case where the p-electrode 17 has the reflectivity to the light emitted from the active layer 13 is described. However, the configuration of the p-electrode 17 is not limited to this. The p-electrode 17 only needs to be formed on the p-type semiconductor layer 15, 21, or 31. Then, the p-type semiconductor layers 15, 21, and 31 only need to include the contact layers 15B, 21A, and 31A in contact with the p-electrode 17. Accordingly, the satisfactory ohmic contact is formed between the p-type semiconductor layers 15, 21, and 31 and the p-electrode 17, and the p-electrode 17 has the reflectivity to the light emitted from the active layer 13, thereby allowing providing the high luminous efficiency.

As described above, for example, the light-emitting element 10 includes the n-type semiconductor layer 12 having the AlGaN composition, the active layer 13 that is formed on the n-type semiconductor layer 12 and contains the AlGaN semiconductor, the p-type semiconductor layer 15 that is formed on the active layer 13 and has the composition of AlN, AlGaN, or AlInGaN, and the p-electrode 17 formed on the p-type semiconductor layer 15.

The p-type semiconductor layer 15 includes the contact layer 15B that is formed on the p-electrode 17 and contains the AlGaN layer or the AlInGaN layer in which the band gap decreases toward the interface with the p-electrode 17. The contact layer 15B includes the tunneling contact layer 15BT that is in contact with the p-electrode 17 and connected to the p-electrode 17 by the tunnel junction. The light-emitting elements 20 and 30 include the contact layers 21A and 31A similar to the contact layer 15B. Accordingly, the light-emitting elements 10, 20 and 30 having the high output power in the ultraviolet region can be provided.

REFERENCE SIGNS LIST 10, 20, 30 semiconductor light-emitting element
12 n-type semiconductor layer
13 active layer
15, 21, 31 p-type semiconductor layer
15B, 21A, 31A contact layer

The invention claimed is:

1. A semiconductor light-emitting element having an emission wavelength band with a peak wavelength in an ultraviolet region from 200 nm to 365 nm, the semiconductor light-emitting element comprising:
an n-type semiconductor layer that has a composition of AlGaN or AlInGaN;
an active layer formed on the n-type semiconductor layer, the active layer containing an AlGaN semiconductor or an AlInGaN semiconductor;
a p-type semiconductor layer formed on the active layer, the p-type semiconductor layer having a composition of AlN, AlGaN, or AlInGaN; and
a p-electrode formed on the p-type semiconductor layer, the p-electrode being made of metal or metal oxide, wherein:
the p-type semiconductor layer includes a contact layer formed near an interface between the p-type semiconductor layer and the p-electrode, and the contact layer is an AlGaN layer or an AlInGaN layer in which an Al composition decreases toward the interface between the p-type semiconductor layer and the p-electrode so that a band gap of the contact layer decreases continuously toward the interface between the p-type semiconductor layer and the p-electrode,
the contact layer includes a tunneling contact layer in contact with the p-electrode, and the tunneling contact layer is connected to the p-electrode by a tunnel junction,
a decrease rate of the Al composition in the contact layer toward the interface between the p-type semiconductor layer and the p-electrode is 0.0008 nm$^{-1}$ to 0.05 nm$^{-1}$,
the active layer has a quantum well structure that includes a well layer and a barrier layer,
a band gap of the barrier layer is larger than a band gap of the well layer,
the well layer consists of an AlGaN layer having a composition of $Al_{x1}Ga_{1-x1}N$, and an Al composition of the well layer is 0.5 or greater than 0.5, and
the band gap of the contact layer varies in a band gap range greater than the band gap of the well layer.

2. The semiconductor light-emitting element according to claim 1, wherein the p-electrode includes a laminate of a Ni layer and an Au layer, a laminate of a Pt layer and an Au layer, a laminate of a Pd layer and an Au layer, a laminate of Al on ITO, a Rh layer, or a Ru layer.

3. The semiconductor light-emitting element according to claim 1, wherein a band gap of the p-type semiconductor layer is larger than the band gap of the well layer.

4. The semiconductor light-emitting element according to claim 1, wherein the n-type semiconductor layer, the active layer, and the p-type semiconductor layer are semiconductor layers epitaxially grown on a single crystal AlN substrate.

5. The semiconductor light-emitting element according to claim 1, wherein:
the p-type semiconductor layer includes a p-type cladding layer formed in an active layer side with respect to the contact layer, and
the contact layer has a higher dopant concentration than the p-type cladding layer in a proximity of the interface between the p-type semiconductor layer and the p-electrode.

6. The semiconductor light-emitting element according to claim 1, wherein the decrease rate of the Al composition in the contact layer decreases toward the interface between the p-type semiconductor layer and the p-electrode.

7. The semiconductor light-emitting element according to claim 1, wherein the decrease rate of the Al composition in the contact layer increases toward the interface between the p-type semiconductor layer and the p-electrode.

8. The semiconductor light-emitting element according to claim 1, wherein the contact layer has a layer thickness of 20 nm to 60 nm.

9. The semiconductor light-emitting element according to claim 1, wherein the n-type semiconductor layer, the active layer, and the p-type semiconductor layer are in a pseudomorphic state.

10. The semiconductor light-emitting element according to claim 1, wherein the contact layer has a composition of $Al_yGa_{1-y}N$, where $0.6 \leq y \leq 0.8$.

* * * * *